United States Patent [19]

Knauth et al.

[11] Patent Number: 5,490,477

[45] Date of Patent: Feb. 13, 1996

[54] PROCESS FOR THE PRODUCTION OF SEMICONDUCTOR FOILS AND THEIR USE

[75] Inventors: Philippe Knauth, Marseille Cedex, France; Horst Lange, Bochum, Germany; Ingo Schwirtlich, Krefeld, Germany; Karsten Wambach, Ratingen, Germany

[73] Assignee: Bayer Aktiengesellschaft, Germany

[21] Appl. No.: 125,937

[22] Filed: Sep. 23, 1993

Related U.S. Application Data

[63] Continuation of Ser. No. 835,511, Feb. 14, 1992, abandoned.

[30] Foreign Application Priority Data

Feb. 26, 1991 [DE] Germany .................. 41 05 910.7

[51] Int. Cl.⁶ .................................................. C30B 13/08
[52] U.S. Cl. ................... 117/43; 117/41; 117/42; 117/46; 117/47; 117/933
[58] Field of Search ..................... 117/43, 41, 42, 117/46, 47, 933

[56] References Cited

U.S. PATENT DOCUMENTS

| | | | |
|---|---|---|---|
| 3,092,462 | 6/1963 | Goorisen | 156/620.71 |
| 4,200,621 | 4/1980 | Liaw et al. | 156/DIG. 64 |
| 4,330,582 | 5/1982 | Lindmayer | 158/DIG. 64 |
| 4,602,980 | 7/1986 | Ellis et al. | 156/620.71 |
| 5,069,740 | 12/1991 | Levine et al. | 156/DIG. 64 |

*Primary Examiner*—Robert Kunemund
*Attorney, Agent, or Firm*—Connolly & Hutz

[57] ABSTRACT

High purity semiconductor foils, such as silicon foils useful in solar energy cells, are produced by treating an impure semiconductor foil with at least one reactive gas while in the crystallizing state.

12 Claims, 2 Drawing Sheets

PROCESS FOR THE PRODUCTION OF SEMICONDUCTOR FOILS AND THEIR USE

CROSS-REFERENCE TO RELATED APPLICATION

The present application is a continuation of application Ser. No. 07/835,511, filed Feb. 14, 1992, now abandoned.

This invention relates to a process for the production of high-purity semiconductor foils, more particularly silicon foils, and to their use.

BACKGROUND OF THE INVENTION

Compared with conventional energy sources, photovoltaic cells are in a difficult competitive situation from the economic point of view. The ultimate objective of photovoltaic cells, particularly for environmental reasons, is to produce current competitively with known energy sources.

Solar cells based on crystalline silicon have been successfully used in practice. Relatively large production plants are available and, in most cases, are alreay able to utilize the cost-reducing potential of mass production. However, other measures are necessary for improving competitiveness. Reducing the cost of the silicon wafers used as starting material is an important point in this connection.

A significant improvement in the cost situation is seen in the replacement of the conventional block casting process with subsequent mechanical slicing into wafers by high-speed foil casting processes.

In high-speed foil casting processes it is important to ensure that no intrinsic lattice defects are developed during the crystallization process. In general, residual impurities in the melt phase are directly incorporated in the crystallizing foil because segregation generally cannot be utilized on account of the high growth rate. Accordingly, purification of the foils requires subsequent treatment.

Numerous processes for purifying solid or molten silicon are known from the literature.

The known zone purification processes can be used for purification. In addition, it was proposed in EP-A 125 630 to subject the silicon to mechanical size reduction and to treat the size-reduced material chemically, for example by acid leaching, in such a way that the impurities are removed. However, it is not possible by this method to reduce the residual concentration of metals to the low values required of less than 0.1 ppm-wt.

U.S. Pat. No. 4,231,755 describes a process in which a roller of silicon-resistant material, of which the temperature is below the melting temperature of silicon, is rotated through a bath filled with the impurities molten silicon. In a second step, the silicon which has solidified on the surface of the roller is introduced into a zone with a temperature above its melting temperature, re-melted and collected. The residual melt enriched with impurities is periodically drained off.

Purification processes for silicon melts using reactive gas mixtures are also known from U.S. Pat. No. 4,298,423, according to which molten silicon is purified with nonoxidizing gases consisting of hydrogen, nitrogen, argon, helium, neon or mixtures thereof, preferably hydrogen. In the process according to DE-A 3 504 723, silicon in the molten state is purified by blowing in hydrogen.

According to EP-A 0 264 045, the simultaneous treatment of silicon melts with gaseous halogen compounds and steam and/or hydrogen has proved successful. The gaseous halogen compounds may be halosilanes $Si_nX_{2n+2}$ (n=1–4, X=halogen or hydrogen), silicon tetrachloride or hydrogen chloride. It is of advantage to add an inert gas, for example argon or helium, to the reactive gases.

EP-A 0 274 283 describes a process for the purification of size-reduced silicon under a plasma. In the first step, the silicon is melted under a plasma of 1 to 100% hydrogen and 99 to 0% argon and, in a second step, the molten silicon is treated with a plasma of argon, oxygen and hydrogen, between 0.005% and 0.05% oxygen and between 1% and 99.995% hydrogen being present.

The purification processes mentioned involve several additional cost-intensive steps and cannot be applied to already produced wafers and foils.

DE-A 3 712 443 describes the purifying effect of an oxygen treatment on silicon wafers produced by the WEB ribbon-growth process. After ribbon-growth, the silicon wafers are subjected to a separate high-temperature treatment in an oxygen-containing atmosphere. Accordingly, the process in question contains an additional cost-intensive step after the ribbon-growth process. It is not possible by this process to purify the foils during their crystallization, i.e. at the speed of the growing step.

Accordingly, the problem addressed by the present invention was to provide a process which would not have any of the disadvantages of the described processes.

BRIEF DESCRIPTION OF THE INVENTION

The process of the present invention produces high purity semiconductor foils, such as silicon foils useful in solar energy cells, by treating impurities containing semiconductor foil with reactive gases while the foil is in the crystallizing state.

DETAILED DESCRIPTION

Figure 1:
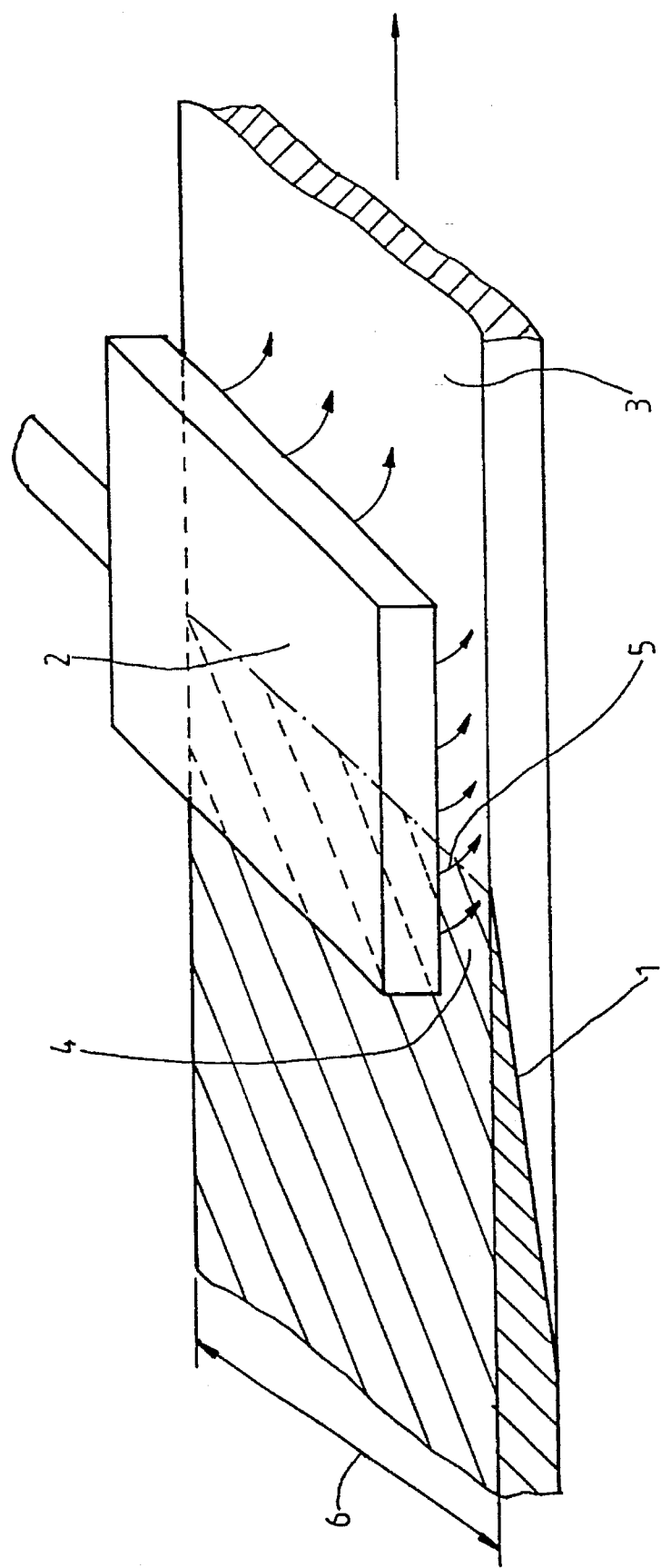
FIG. 1 and FIG. 2 both illustrate a device for contacting a crystallizing semiconductor foil with a reactive gas.

It has now surprisingly been found that it is possible to integrate the purification step in the production of semiconductor foils obtained by controlled solidification and reactive gas treatment. To this end, the semiconductor is present in crystallizing form during the gas treatment.

Accordingly, the present invention relates to a process for the production Of high-purity semiconductor foils which is characterized in that the semiconductive foils are treated with reactive gases in the crystallizing state.

The process according to the invention can be operated particularly economically if the treatment is carried out in the region of the two-phase zone between the molten phase and the solid phase.

The process is based on a combination of the purifying effect by segregation, i.e. the accumulation of impurities on the molten phase during crystallization, and the depletion of impurities which have passed to the surface of this molten phase by a reactive gas treatment. The resulting volatile compounds of impurities with the treatment gas escape through the gas phase while the non-volatile impurities and compounds remain at the surface.

The effectiveness of the process according to the invention is greater, the larger the ratio between the surface treated with the gas and the volume of the crystallizing semiconductor.

Accordingly, this process is preferably applied to crystallizing wafers or ribbons or foils which have a particularly favorable surface to volume ratio, although it may also be applied with advantage to crystallizing cast blocks of which the molten phase is made up by post-charging, as present in continuous casting.

In high-speed ribbon-growth processes, segregation of the residual impurities is generally not possible or is undesirable because the segregating foreign atoms would accumulate in the residual melt.

An exception is the process claimed in EP-A 165 449 (equivalent to U.S. Pat. No. 4,670,096) which is characterized by a high growth rate of several meters per minute for a low crystallization rate of a few centimeters per minute. The foils thus produced are particularly suitable for the process according to the invention as are those produced by the process disclosed in EP-A 123 863 (equivalent to U.S. Pat. No. 4,790,871).

In the process of EP-A 165 449, when the molten semiconductor material makes contact with the material of the support, a thin layer of solidified semi-conductor material will form, provided the temperature of the substrate is below the melting point of the semi-conductor. This solidified layer will continue to grow by removal of heat from the undersurface of the support during the forward movement under the molding body so long as contact with the liquid phase is maintained. At the sate of dynamic equilibrium, a growth wedge corresponding in length to the effective length of the molding body will be formed.

This growth process may be positively influenced by adjusting a temperature gradient between the molding body and the support. It is particularly advantageous to provide a smaller temperature gradient on the side of the molding body facing the direction of pull than on the opposite side.

Other molding bodies are, of course, also suitable for producing the foil, for example, a rigidly mounted body having an opening on the side facing the direction of pull corresponding to the thickness of the film.

It is immaterial for the process of EP-A 165 449 whether the substrate is pulled forwards from under the molding body or the molding body is pulled over the substrate. Moreover, this relative displacement need not be restricted to the horizontal plane. It may still be carried out satisfactorily when the support is inclined to the horizontal at an angle of up to 35 30°. The maximum angle is determined by the ratio of the hydrostatic pressure to the surface tension of the melt at the lower edge of the molding body, by its wetting characteristics, the direction of pull and the relative velocity of the molding body to the support.

The process of EP-A 165 449 is applicable to semiconductors in general and is particularly suitable in its application to silicon as semi-conductor. This may be used in any degree of purity and doped material may, of course, also be used.

Multiple foils may also be produced by the process of EP-A 165 449 in which case a fresh layer is applied to a foil already produced so that the completed foil serves as support. These multiple foils may contain differently doped layers if differently doped semi-conductors are used. The width of the folks produced by the process is limited only by the width of the molding body.

EXAMPLE 1 of EP-A 165 449

The molding body used for applying the silicon to the carrier material consisted of a graphite frame having an internal width of 50 mm x 40 mm and a height of 15 mm. Its wall thickness was 10 mm. This body was placed directly on a graphite plate used as substrate. Another graphite frame held the molding body so that it could only move in an upward direction. The frame was designed so that it also served as connecting element between the two side walls. Resistance heaters having a large surface area were provided, one below the substrate plate and one above the frame. These heaters regulated to the supply of heat to the silicon melt and to the support plate. The silicon was melted in a tilting crucible arranged on the outside and poured into the molding body, which was preheated to from 1380° to 1420° C., through the quartz funnel and an opening in the heater. At the same time, the support material was pulled forwards under the molding body at a speed of 1.2 m/min. A band of solidified silicon about 50 mm in width formed when the substrate was at a temperature of from 1000° to 1200° C. During the subsequent cooling process, this band became detached from the substrate plate without external means so that it could be removed when cold. The thickness of the band was about 0.5 mm, while its length, due to the dimensions of the apparatus, was about 150 mm.

EXAMPLE 2 of EP-A 165 449

The procedure was the same as described in Example 1, but using a frame of silicon nitride and a support material in the form of a substrate plate of silicon carbide which had been coated with silicon nitride/oxide. A silicon film 0.4 mm in thickness produced on a substrate having a length of about 500 mm could easily be separated from the support material. The silicon film obtained had a length of 300 mm.

EP-A 123 863 describes a process for the recrystallization and purification of strip-shaped films of metals or metalloids, in which process one or more locally restricted melting zones are produced and are moved through the film, these melting zones having a motion component which is transverse to the drawing direction of the strip-shaped films.

One method is particularly preferred in which the strip-shaped films are moved continuously. In one particularly preferred embodiment of EP-A 123 863, a hating source is guided transversely to the drawing direction of the strip-shaped films, as a result of which the melting zone passes through an angle which is greater than 0° and smaller than ≦90°, preferably from 30° to 60°, to the drawing direction of the strip-shaped film or of the heating source.

The process according to EP-A 123 863 is particularly advantageous for the purification of silicon or germanium films.

The longitudinal component of the movement may be effected by a transport of the strip-shaped film, and the transverse component may be effected by the movement of the heat source. The heat source may be a resistance-heated or an inductively heated coil which is positioned at a small spacing above the strip (1 to 4 mm) transversely to the principal direction thereof.

Continuous crystallization is present when semiconductor ribbons are obtained. The intermittently continuous crystallization process gives separate semiconductor wafers.

The low crystallization rate parallel to the surface provides for the segregation of residual impurities which accumulate in a thin melt film which only solidifies when it is no longer in contact with the stock melt. Contamination of the stock melt is thus avoided.

Depletion of the impurities concentratd in the surface layer is possible by the treatment with reactive gases. This does presuppose a homogeneous reaction gas of uniform composition and volume at the foil surface. In addition, it is important to ensure that the volatile impurity compounds are removed from the reaction zone immediately after their formation.

To this end, the reaction gas is contacted with the crystallizing foil in thoroughly mixed and dispersed form. The establishment of a laminar flow in the dawing direction of the foil ensures that the process gases are removed from the reaction zone.

The final purity is obtained by a concluding etching step or a mechanical surface treatment.

A possible apparatus for carrying out the process is shown in FIG. 1. In this apparatus, a gas outlet (2) is arranged in the region of the two-phase zone (1) of the crystallizing foil in such a way that the emerging semiconductor foil (3), on the upper surface of which a certain quantity of molten material (4) is entrained, is treated with the reactive gas mixture 5. The gas outlet (2) extends over the entire width (6) of the foil, as shown in FIG. 1.

Figure 2:
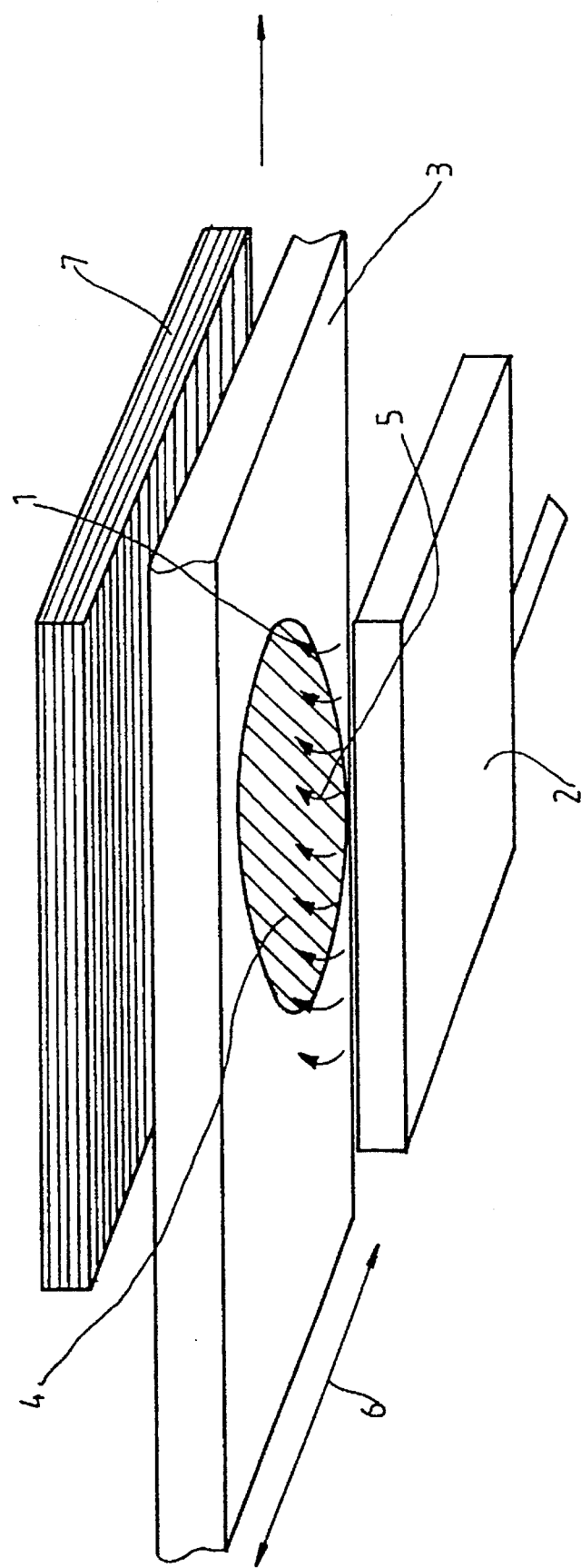

Favorable embodiments are, for example, a frit, a quartz frit having several compartments or a die having one slot (FIG. 2) extending over the width (6) of the foil of several slots. Before issuing from the gas outlet (2), the gas mixture may be additionally heated or cooled to influence the mechanical properties of the crystallizing metal, for example to prevent thermal stresses from occurring. FIG. 2 also shows a heating device (7).

The process according to the invention is suitable for the purification of different semiconductor foils. By virtue of the fact that, in the case of silicon, any increase in purity is accompanied by a considerable improvement in technical efficiency, the process is particularly suitable for the purification of silicon foils.

Oxygen, hydrogen, steam or mixtures of oxygen and steam or hydrogen and steam and also halogen-containing gases according to EP-A 264 045 (equivalent to U.S. Pat. No. 4,837,376) may be used as the reactive gases. EP-A 264 045 describes that it has proven advantageous when carrying out the process to add inert gas to dilute the reactive gases when using halogen silanes and when using hydrogen chloride. Inert gases include those which do not enter into a reaction under the reaction conditions. Argon and helium are mentioned by way of example, but other noble gases are also available. In the context of the invention, inert gas are gases which do not enter into any reaction under the reaction conditions. Argon and helium are mentioned as preferred inert gases. In that case, the gas mixture (5) consist of at least 30% by volume argon and/or helium and up to 70% by volume oxygen either dry or saturated with steam or at least 70% by volume argon or helium and 1 to 30% by volume hydrogen with steam. Alternatively, the purification process may also be integrated in the ribbon growth process according to EP-A 123 863.

The application of the process according to the invention leads to a significant reduction in the carbon impurities in the foil. The carbon content of the silicon foils treated with a reactive gas mixture is lower by comparison with that of foils grown solely in an inert gas. A depletion of boron and phosphorus is also observed. The depletion of metallic impurities, such as chromium, titanium, calcium, magnesium, iron, molybdenum, nickel, copper, is promoted by an additional etching step. Inorganic acids, such as hydrofluoric acid, hydrochloric acid, sulfuric acid or mixtures thereof, or alkali hydroxides, such as sodium or potassium hydroxide, may be used for this purpose.

In one preferred embodiment of the process according to the invention, therefore, the semiconductor foils are subsequently treated with inorganic acids, such as for example hydrofluoric acid, hydrochloric acid, sulfuric acid or mixtures thereof, or with alkalis, such as for example NaOH or KOH.

The impurities concentrated at the surface of the semiconductor foils can also be removed by mechanical separation or by a chemical treatment with inorganic acids and alkalis. Particularly good results are obtained when the upper surface of the semiconductor is mechanically eroded to a depth of 5 μm to 60 μm and preferably 20 μm.

The present invention also relates to the use of the silicon foil produced in accordance with the invention as a starting material for solar cells.

Without limiting the scope of the invention in any way, the following Examples are intended to illustrate the process according to the invention applied to the crystallization of foils using silicon as the metal.

EXAMPLES

Example 1

A reactive gas mixture consisting of 20% by volume oxygen and 80% by volume argon is used in the crystallization of foils by the process described in EP-A 165 449. The gas is introduced through a quartz frit arranged approximately 1 centimeter above the substrate in the region of the solid/liquid phase boundary. The frit extends over the entire width of the silicon foil and is 10 cm wide and 2 cm long. The throughflow rate of the gas mixture is approximately 5 $m^3$ per hour and the inert gas pressure in the plant before the introduction of the reactive gas is 800 mbar. Under the effect of the molten silicon at the foil surface, the temperature in the gas treatment zone is near the temperature of the two-phase equilibrium between liquid and solid silicon, i.e. approximately 1,410° C. After cooling, the silicon foils are treated with sodium hydroxide (20%) for 10 minutes at 70° C. for surface purification. The purifying effect of the reactive gas treatment is apparent from the Table which shows the analytical data of the individual impurity elements in ppmwt (ppm by weight) for two different reactive process gases by comparison with crystallization in argon as the inert gas.(see Table, line a). The foils were then subjected to the above-mentioned treatment with sodium hyroxide. The analytical data are shown in the Table, line b.

Example 2

A gas mixture of 80% by volume argon and 20% by volume oxygen saturated with steam at 100° C. was used. The gas was passed through a quartz nozzle having a slot-like opening of (10·0.02) $cm^2$. The throughflow rate of the gas mixture was 1 $m^3$ per hour. After cooling, the foils were etched as described above. The analytical results of the pieces of foil treated with reactive gas mixture are shown in the Table, line c. A purifying effect comparable with that of Example 1 is observed.

TABLE

Comparison of the analytical data of silicon foils produced in atmospheres of argon (a), argon (80%)/oxygen (20%) dry (b) and argon (80%)/oxygen (20%) saturated with steam (c) (ppmwt).

|   | Al  | B   | Ca  | Cr  | Cu  | Fe  | Mg  | Mo  | Ni  | Ti  | P   | C   |
|---|-----|-----|-----|-----|-----|-----|-----|-----|-----|-----|-----|-----|
| a | 0.7 | 0.5 | 0.3 | 0.5 | 0.5 | 1.0 | 0.2 | 1.0 | 0.6 | 0.3 | 0.3 | 300 |
| b | 0.1 | 0.2 | 0.1 | 0.1 | 0.1 | 0.5 | 0.1 | 0.1 | 0.1 | 0.1 | 0.2 | 35  |
| c | 0.4 | 0.1 | 0.1 | 0.1 | 0.1 | 0.3 | 0.3 | 0.1 | 0.3 | 0.1 | 0.2 | 20  |

What is claimed is:

1. A process for the production of high-purity semiconductor foils which comprises treating semiconductor foils having an upper surface with reactive gases in the directionally crystallizing state to deplete volatile compounds of impurities from the upper surface of the foil through escape with the reactive gases, the crystallization direction being parallel to a vector normal to the upper surface of the foil.

2. A process as claimed in claim 1 wherein the treatment is carried out in the region of the two-phase zone between the molten phase and the solid phase.

3. A process as claimed in claim 1 wherein the semiconductor foil is a silicon foil.

4. A process as claimed in claim 1 wherein the reactive gases comprise oxygen, steam, hydrogen, or mixtures of oxygen/steam or hydrogen/steam and halogen-containing gases.

5. A process as claimed in claim 4 wherein the reactive gas is mixed with at least one inert gas which is argon or helium.

6. A process as claimed in claim 5 wherein up to 70% of the mixture of reactive and inert gases consists of an oxygen/steam mixture and at least 30% of argon, helium or an argon/helium mixture.

7. A process as claimed in claim 5 wherein up to 30% of the mixture of reactive and inert gases consists of a hydrogen/steam mixture and at least 70% of argon, helium or an argon/helium mixture.

8. A process as claimed in claim 1 wherein the treated semiconductor foils are subjected to an aftertreatment with inorganic acids or with alkali hydroxides.

9. A process as claimed in claim 8 wherein the aftertreatment is to contact the treated foil with at least one hydrofluoric acid, hydrochloric acid, sulfuric acid, sodium hydroxide or potassium hydroxide.

10. A process as claimed in claim 1 wherein a surface of the treated semiconductor foils is mechanically eroded to a depth of 5 μm to 60 μm.

11. A process as claimed in claim 9 wherein the depth of mechanical erosion is about 20 μm.

12. In an improved solar cell containing silicon foil, the improvement comprises said silicon foil being a foil prepared by the process in claim 1 wherein said semiconductor is silicon.

* * * * *